Figure 1:
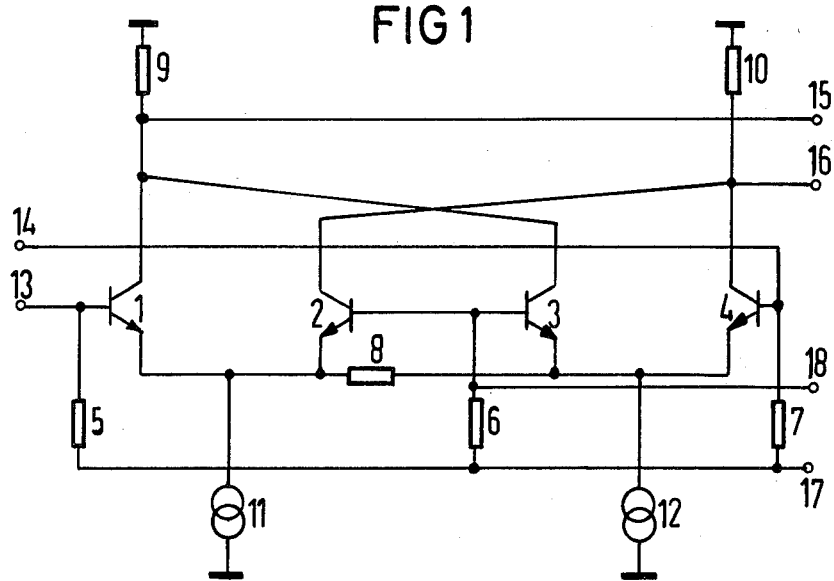

United States Patent [19]

Fenk

[11] 4,369,410
[45] Jan. 18, 1983

[54] MONOLITHICALLY INTEGRABLE TRANSISTOR AMPLIFIER HAVING GAIN CONTROL MEANS

[75] Inventor: Josef Fenk, Eching, Fed. Rep. of Germany

[73] Assignee: Siemens Aktiengesellschaft, Berlin and Munich, Fed. Rep. of Germany

[21] Appl. No.: 156,863

[22] Filed: Jun. 5, 1980

[30] Foreign Application Priority Data

Jun. 15, 1979 [DE] Fed. Rep. of Germany ....... 2924171

[51] Int. Cl.³ .............................................. H03G 3/30
[52] U.S. Cl. ................................................ 330/254
[58] Field of Search .......................... 330/254; 358/27

[56] References Cited

U.S. PATENT DOCUMENTS 3,210,683 10/1965 Pay ................................. 330/254 X
3,452,289 6/1969 Ryan ................................. 330/254
4,109,214 8/1978 Main ................................. 330/254

OTHER PUBLICATIONS

"A Wideband Multiplier for Systems Design", *Electronic Engineering*, Jun. 1972, pp. 18,19.
Tietze et al., *Halbleiter-Schaltungstechnik*, 1978, pp. 53-59.

*Primary Examiner*—James B. Mullins
*Attorney, Agent, or Firm*—Herbert L. Lerner; Laurence A. Greenberg

[57] ABSTRACT

Monolithically integrable transistor amplifier including four transistors of the same type having respective emitters, collectors and bases, a signal input connected to the base of a first one of the transistors, the emitter of the first transistor being connected to the emitter of a second one of the transistors, means for providing a power source connected by a terminal thereof to the emitters of the first and second transistors and by another terminal thereof via a respective load resistance to the collectors of the first and second transistors, a third one and a fourth one of the transistors being connected by the respective emitters thereof to one another, the respective bases of the second and the third transistors being connected to one another, the third transistor being connected to the fourth transistor in the same manner, as the first transistor is connected to the second transistor, the respective collectors of the first and third collectors, on the one hand, and of the second and fourth collectors, on the other hand, being directly connected to one another and including a common connection between respective terminals of the bases and a common connection between respective terminals of the emitters of the four transistors, and a reference input connected to the respective terminals of the bases of the second and third transistors for applying a signal or potential thereto.

6 Claims, 2 Drawing Figures

MONOLITHICALLY INTEGRABLE TRANSISTOR AMPLIFIER HAVING GAIN CONTROL MEANS

The invention relates to a monolithically integrable transistor amplifier having a signal input connected to the base of a first transistor, the emitter of which is connected to the emitter of a second transistor of the same type, and, furthermore, having a power source, especially a constant-current source, connected by one terminal thereof to the emitters of the first and second transistors and by the other terminal thereof via a load resistor to the collectors of the first and second transistors, and having a signal output connected to the collector of the second transistor.

Transistor amplifier circuits of this general type are known and are designated and employed as differential amplifiers. In this regard the book by U. Tietze-Ch. Schenk "Halbleiter-Schaltungstechnik" (Semiconductor Circuit Technology) (1978), page 59, can be mentioned as an example.

It is an object of the invention to provide a monolithically integrable transistor current amplifier which, although indeed requiring greater current drain than for heretofore-known emitter-coupled differential stages, nevertheless assures a higher drive level, corresponding to this greater current drain. Thus, with twice the current, for example, twice the drive level also is provided. To produce the same result, the heretofore known amplifiers had to be equipped with expensive control circuitry which, furthermore, when in monolithic form, resulted in considerable parasitic substrate currents and also in a control current requirement, which was so large that it was no longer in proportion to the attained drive level. In particular, the following can be stated in this connection:

In integrated amplifiers, the signals are preferably processed in symmetrical form. The linear range of a differential stage therein is approximately 2. $U_t$, wherein $U_T$ is the temperature voltage. It can be increased through emitter resistors by the amount of voltage drop at these resistors. For circuit applications to effect gain control, for example, transistors connected as diodes can be used in the emitter branch of differential stages. A noticeably increased drive level range is thereby achieved, compared to the normal emitter-coupled differential stages without negative feedback. However, in a monolithically integrated semiconductor circuit, due to the operation of the foregoing structures, such a procedure causes the complementary substrate resistor to be activated in the residual voltage range, which leads to a more than proportional control current requirement or, with the control current fixed, to a spread of the gain. Since the useful control current manages to get into the active part of the control circuit, a change in the operating point of the differential stage results, moreover, as well as an undesirable change in the collector operating or supply voltage.

On the other hand, the negative feedback resistor in the emitter of the differential stage can be short-circuited by a transistor which is operated in the residual voltage range, which, however, likewise leads to unsatisfactory results. In addition, a diode ring can be used for the negative feedback, whereby the negative effect of substrate currents and the undesirable change in the collector operation or supply voltage can be avoided, but not the excessive expenditure of control current, as in the other possible embodiments just mentioned.

With the foregoing and other objects in view, there is provided in accordance with the invention, a monolithically integrable transistor amplifier comprising four transistors of the same type having respective emitters, collectors and bases, a signal input connected to the base of a first one of the transistors, the emitter of the first transistor being connected to the emitter of a second one of the transistors, means for providing a power source, especially a constant current source connected by a terminal thereof to the emitters of the first and second transistors and by another terminal thereof via a respective load resistance to the collectors of the first and second transistors, a third one and a fourth one of said transistors being connected by the respective emitters thereof to one another, the respective bases of the second and the third transistors being connected to one another, the third transistor being connected to the fourth transistor in the same manner as the first transistor is connected to the second transistor, the respective collectors of the first and third collectors, on the one hand, and of the second and fourth collectors, on the other hand, being directly connected to one another, and including a common connection between respective terminals of the bases and a common connection between respective terminals of the emitters of the four transistors, and a reference input connected to the respective terminals of the bases of the second and third transistors for applying a signal or potential thereto.

Thus, a controllable circuit arrangement is obtained which avoids the disadvantages of the heretofore known arrangements resulting from parasitic currents, while maintaining the same drive level range. The controllable circuit arrangement further reduces the control current requirement by the factor of the current gain, and avoids detrimental operating point shifts of the collector voltage as well as other disadvantages. In addition, the stage can be operated so as always to control with the same collector-emitter voltage.

In a transistor amplifier according to the invention, an emitter-coupled differential stage, the negative feedback resistor R of which can have resistance values up to $R = \infty$, depending upon the range of the control, is connected, in accordance with the definition given above, to a base-coupled differential stage in such a manner that a respective emitter of the base-coupled differential stage is connected to a respective emitter of the emitter-coupled differential state. A novel and patentable feature of the invention is that the collectors are combined in pairs according to the phase of the collector signal and are connected to two outputs.

In accordance with another feature of the invention, the respective bases of the second and third transistors are directly connected, and a resistance is connected between the reference input and the respective base terminals of the second and the third transistor, and a respective intermediate resistance between the base terminals of the first and the fourth transistors on the one hand, and the reference input, on the other hand.

In accordance with a further feature of the invention, the second and the third transistors form a base-coupled differential stage, and control means are connected to the base terminals of the second and the third transistors for adjusting the operating point of the differential stage.

In accordance with an additional feature of the invention, the connection between the bases of the second and the third transistors comprises a control circuit and a respective intermediate resistance is connected between the base terminals of each of the transistors, respectively, and the reference input.

In accordance with a concomitant feature of the invention, the first and the fourth transistors have base terminals connected to an input for signals to the amplifier.

Other features which are considered as characteristic for the invention are set forth in the appended claims.

Although the invention is illustrated and described herein as embodied in a monolithically integrable transistor amplifier, it is nevertheless not intended to be limited to the details shown, since various modifications and structural changes may be made therein without departing from the spirit of the invention and within the scope and range of equivalents of the claims.

Figure 2:
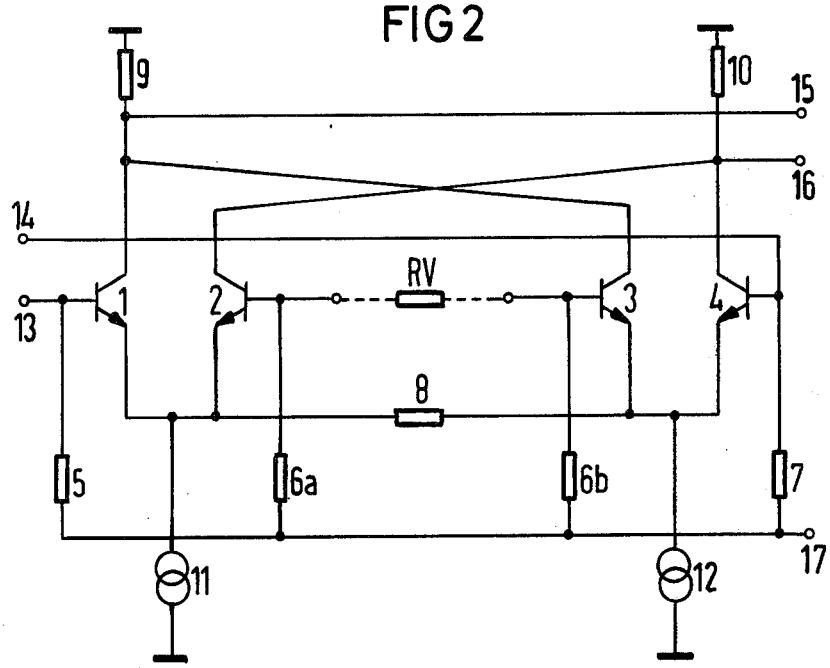

The construction and method of operation of the invention, however, together with additional objects and advantages thereof will be best understood from the following description of specific embodiments when read in connection with the accompanying drawings, in which:

FIGS. 1 and 2 are circuit diagrams of different embodiments of the monolithically integrable transistor amplifier according to the invention, both embodiments having a base-coupled stage, at the terminal of which gain control can be effected either by current division control (FIG. 1) or by negative feedback control (FIG. 2).

Like parts in both figures are identified by the same reference characters.

Referring now to the figures of the drawing, there are shown two input terminals 13 and 14 between which a symmetrical input signal is applied. Transistors 1 and 4 are input transistors having an emitter coupling which is determined by the negative feedback resistor 8. A transistor 2 and a transistor 3 represent a base-coupled differential stage, the operating point and, consequently, the gain of which can be adjusted via a control line 18 in the embodiment shown in FIG. 1. Maximum gain is obtained if the same amount of current flows through all four of the transistors 1, 2, 3 and 4, and the negative feedback resistance 8 is reduced by the symmetrically effective emitter input impedance of the transistor 3 and the transistor 4 to the value:

$$2(U_T/I_{E3,4}) + (r_b/\beta)$$

where:
$U_T$ = temperature voltage;
$I_{E3,4}$ = emitter currents;
$r_b$ = base path resistance
$\beta$ = a-c gain in common-emitter connection.

To the emitters of the transistor pairs 1, 2 and 3, 4, either a d-c potential $V_{EE}$ is connected via a respective series resistor or via the one pole of a constant-current source 11 or 12, respectively. The other terminal of the voltage source supplying the d-c voltage potential $V_{EE}$ or the other terminal of the constant-current source 11 or 12, respectively, is connected via a load resistor 9 or 10, respectively, to the collectors of the transistors 1 and 3, on the one hand, and 2 and 4 on the other hand. These are designed in accordance with the desired stage gain.

In accordance with the foregoing definition of the invention, the four transistors 1, 2, 3 and 4 are of the same type i.e. either all npn-transistors or all pnp-transistors. The emitter of the transistor 1 and the emitter of the transistor 2 are connected to one another, and are also connected either via a series resistor to an operating potential $V_{GG}$ corresponding to the conduction type thereof or, as in FIGS. 1 and 2, to the one terminal of a constant-current source 11. The base of the transistor 1 forms the one signal input 13. The collector of the transistor 1 is connected to a signal output 15 and also, via the load resistor 9, to a second operating potential $V_{CC}$ or to the other terminal of the constant-current source 11.

The emitter of the transistor 3 is connected to the emitter of the transistor 4. Both emitters are either connected, in a first case, via a series resistor to the potential $V_{EE}$ to which the emitters of the transistors 1 and 2 are already connected, or, in a second case, a second constant-current source 12 is provided, the one terminal of which is connected to the emitters of the transistors 3 and 4. In the just-mentioned first case, the collector of the transistor 4 is connected via a load resistor 10 to the second supply potential $V_{CC}$; in the second case, it is connected via the load resistor 10 to the second terminal of the constant-current source 12. Details regarding the design of constant-current sources can be found, for example, in the hereinafore-mentioned book by Tietze-Schenk "Semiconductor Circuit Technology" (1978) pages 53 to 59.

The collector of the transistor 4 forms the other output terminal 16 of the transistor amplifier. The collector of the transistor 2 is connected to the collector of the transistor 4 and the collector of the transistor 1 is connected to the collector of the transistor 3. In the embodiment according to FIG. 1, the base of the transistor 2 is further connected directly to the base of the transistor 3. The emitters of the transistors 1 and 2 are further connected via a negative-feedback resistor 8 to the emitters of the transistors 3 and 4, thereby forming the common connection between the emitters of the four transistors 1 to 4, as mentioned hereinbefore in the definition of the invention. Further provided is a reference input 17 which is to be addressed by or subjected to a reference potential or a reference signal, and which is connected via respective resistors 5, 6 and 7, to the bases of the transistor 1, the transistors 2 and 3, and the transistor 4, respectively. Furthermore, the base of the transistor 4 is connected to the second input terminal 14 of the amplifier.

In the circuit arrangement according to FIG. 2, as aforementioned, so-called negative feedback control is selected and not so-called current division control as in FIG. 1. In FIG. 2, the connection between the base terminals of the two transistors 2 and 3 is interrupted by a circuit member RV which provides the control and which is formed, for example, by a customary control circuit such as a control circuit with two diodes or a diode ring, for example, and then constitutes the connection between the base terminals of the second transistor and the third transistor i.e. the transistors 2 and 3. Minimum gain is obtained if the internal resistance of the circuit member RV goes toward infinity and if the magnitude of the negative feedback resistor 8 determines the gain. Maximum gain is obtained if the internal resistance of the circuit member RV goes toward zero.

There are claimed:

1. Monolithically integrable transistor amplifier comprising four mutually similar transistors formed pairwise by direct connection of emitter electrodes thereof into one differential amplifier including a first and a second transistor, and another differential amplifier including a third and a fourth transistor, the transistors of the respective differential amplifiers having respective emitter electrodes connected in similar manner via a resistance to a first potential source, respective signal inputs connected to base terminals of said first and said fourth transistors, a common reference input connected via a respective resistance to said base terminals of said first and said fourth transistors for applying a reference signal or potential thereto, said first and said third transistors having collectors, on the one hand, and said second and said fourth transistors having collectors on the other hand, which are connected to respective signal outputs and via a common load resistance, respectively, to a second potential source, said second and said third transistors having base terminals connected via resistance means to said common reference input, means for effecting gain control connected to said base terminals of said second and said third transistors, and a negative feedback resistance connected in common to said emitters of said first and said second transistors of said one differential amplifier and in common to said emitters of said third and fourth transistors of said other differential amplifier.

2. Transistor amplifier according to claim 1 wherein said means for effecting gain control comprise current division control means connected to said base terminals of said second and said third transistors and including a direct connection of said base terminals of said second and said third transistors to each other and to a gain control line, and said connection of said base terminals of said second and said third transistors to said common reference input being via a common resistance.

3. Transistor amplifier according to claim 1 wherein said means for effecting gain control comprise negative feedback control means connected to said base terminals of said second and said third transistors and including, on the one hand, a control-effecting circuit member connected to said base terminals of said second and said third transistors, and, on the other hand, said resistance means via which said base terminals of said second and said third transistors are connected to said common reference input being separate resistances, respectively.

4. Monolithically integrable transistor amplifier comprising four mutually similar transistors formed pairwise by direct connection of emitter electrodes thereof into one differential amplifier including a first and a second transistor, and another differential amplifier including a third and a fourth transistor, the transistors of the respective differential amplifiers having respective emitter electrodes connected in similar manner via a respective constant current source to a first potential source, respective signal inputs connected to base terminals of said first and said fourth transistors, a common reference input connected via a respective resistance to said base terminals of said first and said fourth transistors for applying a reference signal or potential thereto, said first and said third transistors having collectors, on the one hand, and said second and said fourth transistors having collectors, on the other hand, which are connected to respective signal outputs and via a common load resistance, respectively, to a second potential source, said second and third transistors having base terminals connected via resistance means to said common reference input, means for effecting gain control connected to said base terminals of said second and said third transistors, and a negative feedback resistance connected in common to said emitters of said first and said second transistors of said one differential amplifier and in common to said emitters of said third and fourth transistors of said other differential amplifier.

5. Transistor amplifier according to claim 4 wherein said means for effecting gain control comprise current division control means connected to said base terminals of said second and said third transistors and including a direct connection of said base terminals of said second and said third transistors to each other and to a gain control line, and said connection of said base terminals of said second and said third transistors to said common reference input being via a common resistance.

6. Transistor amplifier according to claim 4 wherein said means for effecting gain control comprise negative feedback control means connected to said base terminals of said second and said third transistors and including, on the one hand, a control-effecting circuit member connected to said base terminals of said second and said third transistors, and, on the other hand, said resistance means via which said base terminals of said second and said third transistors are connected to said common reference input being separate resistances, respectively.

* * * * *